United States Patent [19]

Chaffin et al.

[11] Patent Number: 4,688,068
[45] Date of Patent: Aug. 18, 1987

[54] QUANTUM WELL MULTIJUNCTION PHOTOVOLTAIC CELL

[75] Inventors: Roger J. Chaffin; Gordon C. Osbourn, both of Albuquerque, N. Mex.

[73] Assignee: The United States of America as represented by the Department of Energy, Washington, D.C.

[21] Appl. No.: 834,670

[22] Filed: Feb. 28, 1986

Related U.S. Application Data

[63] Continuation of Ser. No. 512,059, Jul. 8, 1983, abandoned.

[51] Int. Cl.$^4$ .................. H01L 27/14; H01L 31/00
[52] U.S. Cl. ........................................... 357/30
[58] Field of Search ........................ 357/12, 16, 30; 148/206

[56] References Cited

U.S. PATENT DOCUMENTS

| | | | |
|---|---|---|---|
| 3,993,506 | 11/1976 | Moon | 357/30 |
| 4,017,332 | 4/1977 | James | 357/30 |
| 4,106,951 | 8/1978 | Masi | 357/30 |
| 4,128,733 | 12/1978 | Fraas et al. | 357/30 |
| 4,179,308 | 12/1979 | Olsen et al. | 357/30 |
| 4,227,941 | 10/1980 | Bozler et al. | 357/30 |
| 4,248,675 | 2/1981 | Bozler et al. | 357/30 |
| 4,287,527 | 9/1981 | Bachmann et al. | 357/30 |
| 4,398,054 | 8/1983 | Madan | 357/30 |
| 4,476,477 | 10/1984 | Capasso et al. | 357/30 |
| 4,482,778 | 11/1984 | Anderson | 357/30 |

OTHER PUBLICATIONS

Panish; *Molecular Beam Epitaxy;* Science; vol. 208; May 23, 1980; pp. 916–922.

*Primary Examiner*—Robert E. Wise
*Attorney, Agent, or Firm*—George H. Libman; Judson R. Hightower

[57] ABSTRACT

A monolithic, quantum well, multilayer photovoltaic cell comprises a p-n junction comprising a p-region on one side and an n-region on the other side, each of which regions comprises a series of at least three semiconductor layers, all p-type in the p-region and all n-type in the n-region; each of said series of layers comprising alternating barrier and quantum well layers, each barrier layer comprising a semiconductor material having a first bandgap and each quantum well layer comprising a semiconductor material having a second bandgap when in bulk thickness which is narrower than said first bandgap, the barrier layers sandwiching each quantum well layer and each quantum well layer being sufficiently thin that the width of its bandgap is between said first and second bandgaps, such that radiation incident on said cell and above an energy determined by the bandgap of the quantum well layers will be absorbed and will produce an electrical potential across said junction.

17 Claims, 4 Drawing Figures

QUANTUM WELL MULTIJUNCTION PHOTOVOLTAIC CELL

The U.S. Government has rights in this invention pursuant to Contract No. DE-AC04-76DP00789 between the U.S. Department of Energy and Western Electric Company.

This is a continuation of application Ser. No. 512,059 filed July 8, 1983, now abandoned.

BACKGROUND OF THE INVENTION

This invention relates to a new photovoltaic cell of the multijunction type which is based upon the quantum well effect.

Solar radiation is received as a broad spectrum spanning predominantly the UV through infrared ranges. No single semiconductor junction can efficiently convert this entire spectrum to electricity. Hence, many different multijunction structures grown or stacked on top of one another to form composite solar cells have been proposed in the past. See, e.g., Bedair et al, IEEE Transactions on Electron Devices, Vol.ED-27, No.4, Apr. 1980, page 822; and U.S. Pat. Nos. 3,186,873; 3,478,214; 4,017,332; 4,099,199; 4,128,733; 4,179,702; 4,206,002; and 4,255,211.

One problem encountered in such multijunction devices is derived from the fact that the semiconductor materials in adjacent layers are normally not lattice matched. Furthermore, as Bedair et al, supra, have shown, there are no non-alloy materials which have optimum energy gaps for use in solar cells and which, at the same time, are lattice matched. As a result, in most multijunction solar cells, crystal defects are introduced which cause performance degradation.

One proposed solution is to grow layers of graded composition onto a substrate, e.g., layers of compounds or elements of Group III-V of the Periodic Table on a semiconductor substrate, e.g., $GaP_xAs_{1-x}$ on silicon or $Ge_{1-x}Si_x$ on silicon, starting with $x=1$ at the substrate and gradually increasing the value of x as the layer is grown thicker. At the top end, the lattice constant of the layer of changing composition more nearly matches that of the layer which will be placed thereupon. See, e.g., Fan et al, Appl. Phys. Lett. 37 (11), Dec. 1 1980, page 1024, or U.S. Pat. Nos. 4,206,002 or 4,128,733. However, this process is quite difficult to implement and very often still results in crystalline defects which seriously degrade performance.

Another proposed solution is to grow a strained-layer superlattice between lattice mismatched layers. See, e.g., Matthews et al, J. Vac. Sci. Technol., Vol. 14, No. 4, July/August 1977, page 989. The superlattice consists of very thin alternating layers of dissimilar semiconductor materials. By appropriate selection of thicknesses, the combination of thin layers greatly minimizes the propagation of dislocations from the underlying layers to the upper layers.

It is also known that changes in energy band structure occur when thin layers of dissimilar semiconductor materials are grown on top of each other. These thin layers have energy levels which are different from the bulk semiconductor material from which they are grown. This is a quantum mechanical effect occurring as the layer thicknesses approach the crystal lattice constant. The general, repeating structure is that of a thin semiconductor layer, which in bulk form would have a given bandgap energy, disposed between two layers of another semiconductor material having a wider bandgap energy in bulk. As a result, the bandgap energy of the middle sandwiched layers is between those of the two "bulk" materials as long as the middle layers are sufficiently thin that the quantum mechanical effect occurs. These thin layers thus constitute "quantum wells" which have bandgaps lower than those of the surrounding layers. See, e.g., Panisch, Science, Vol. 208, May 23, 1980, 916–922; L. V. Keldysh, Sov. Phys. Solid State 4, 1658 (1963); L. Esaki and R. Tsu, IBM J. Res. Dev. 14, 61 (1970); R. Dingle et al, Phys. Rev. Lett. 33, 827 (1974); L. L. Chang et al, Appl. Phys. Lett. 28, 39 (1976); R. M. Fleming et al, J. Appl. Phys. 51, 357 (1980); R. Dingle et al, Appl. Phys. Lett. 33, 665 (1978); W. T. Tsang et al, ibid. 35, 673 (1979).

SUMMARY OF THE INVENTION

It is an object of this invention to provide a new solar cell which overcomes or significantly ameliorates the deficiencies of prior art solar cells.

It is another object of this invention to provide such a solar cell having very high efficiency and which is based upon the quantum well effect.

It is yet another object of this invention to provide such a solar cell which incorporates the strained layer superlattice effect to minimize the effects of lattice dislocations.

It is still another object of this invention to provide a solar cell which contains multijunctions having different bandgap energies associated therewith whereby the absorption spectrum of the solar cell can be matched to the solar spectrum (e.g., the terrestrial spectrum) of the sun.

It is a further object of this invention to achieve all this using a new degree of freedom, (layer thickness) to determine the wavelengths of current production.

Upon further study of the specification and appended claims, further objects and advantages of this invention will become apparent to those skilled in the art.

These objects have been attained by providing a monolithic, quantum well, multilayer photovoltaic cell comprising:

a p-n junction comprising a p-region on one side and an n-region on the other side, each of which regions comprises a series of at least three semiconductor layers, all p-type in the p-region and all n-type in the n-region, each of said series of layers comprising alternating barrier layers and quantum well layers, the barrier layers comprising a semiconductor material having a first bandgap and the quantum well layers comprising a semiconductor material having a narrower bandgap when in bulk thickness, the layers of the barrier material sandwiching the quantum well layers and each quantum well layer being sufficiently thin that the width of its bandgap is between that of said first and narrower bandgap, such that radiation incident on said cell and above an energy determined by the bandgap of the quantum well layers will be absorbed and will produce an electrical potential across said junction.

In various preferred aspects, the solar cell of this invention is a multijunction cell wherein, preferably, at least two of said quantum well layers have different quantum well bandgaps; and/or the cell incorporates the strained layer superlattice structure mentioned above; employs tunnel junctions between the p-n junctions to provide shorted electrical contacts therebetween, the tunnel junctions being of conventional format and comprising a heavily doped p+ semiconductor layer and a heavily doped n+ semiconductor layer; has at least two different quantum well bandgaps each associated with a different p-n junction; can have essentially identical quantum well bandgaps in each of the p-n junctions but different p-n junctions have different quantum well bandgaps; can have at least two p-n junctions composed of the same semiconductor materials, each having quantum well layers of different thicknesses whereby the junctions have different quantum well bandgaps and, thus, are responsive to different impinging wavelengths; has its p-n junctions arranged in the order of decreasing bandgap such that the higher frequency radiation is absorbed first and lower frequency radiation is subsequently absorbed in decreasing order of frequency; has all tunnel junctions designed so that the respective bandgaps are at least as large and preferably larger than the narrowest preceding bandgap; in operation, has a semiconductor substrate on which the layers are grown and has conventional electrical contacts for passing the photocurrent out of said cell; has a plurality of p-n junctions, e.g., wherein the number of layers in each p-n junction and the number of p-n junctions per se of a given bandgap are selected such that the cell will absorb essentially all of the radiation impinging thereon, typically solar radiation, especially that in the UV through near infrared regions, e.g., has up to 36 different energy bandgaps; has an antireflection coating on top of the cell; has all layers grown by molecular beam epitaxy; has layers all comprising semiconductor compounds, e.g., binary, ternary, or quaternary compounds, composed of elements of groups III and V of the periodic table, e.g., those having an atomic number greater than or equal to 13, especially Al, Ga, In, P, As or Sb; and/or has layer thicknesses in the range of about 50–500 angstroms.

BRIEF DESCRIPTION OF THE DRAWINGS

Various other objects, features and attendant advantages of the present invention will be more fully appreciated as the same becomes better understood when considered in conjunction with the accompanying drawings, and wherein.

DETAILED DISCUSSION

A key concept of this invention involves the use of thin layers of two or more different semiconductor materials ("quantum wells") grown on top of each other to form a multijunction solar cell, preferably interconnected by tunnel junctions or other equivalent means. A unique feature is the use of variations in quantum well layer thickness to control the energy band of the structure, preferably as a function of position in the device, instead of the conventional use of changes in material to effect bandgap variations. This offers significant advantages over the prior art methods, e.g., graded layers are not required and more different types of materials can be used. For example, only materials which can be alloyed together, such as GaAsP, can be graded.

A further key feature of this invention is the incorporation of the "superlattice" effect mentioned above to reduce material defects due to lattice mismatch which otherwise might occur. Advantageously, both the quantum effect and the strained layer superlattice effect can be achieved in the same layer thickness ranges.

Figure 1:
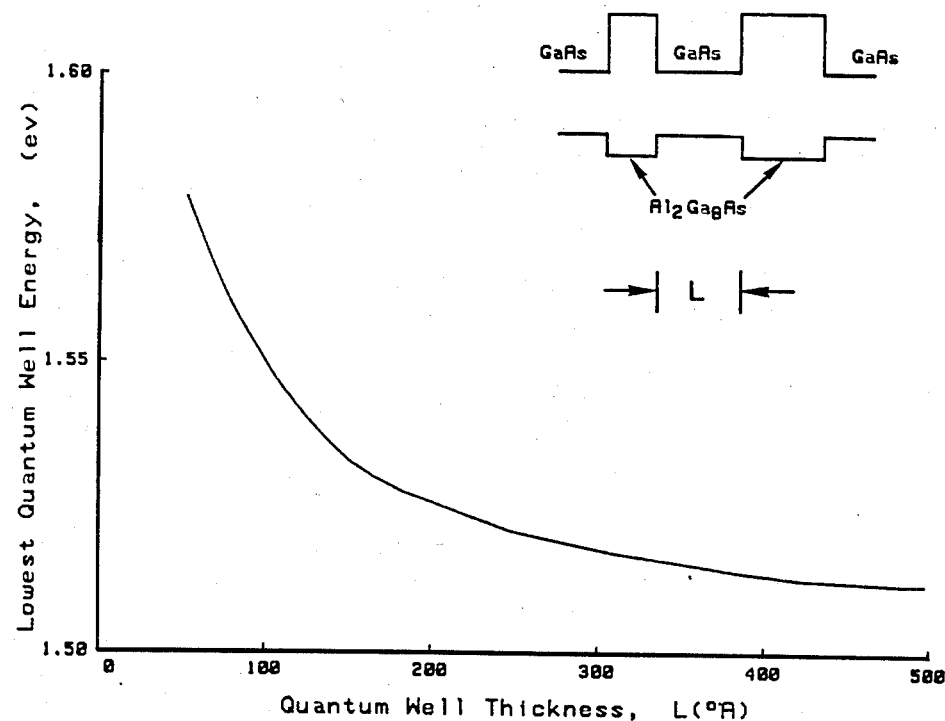
FIG. 1 shows the variation in the lowest quantum well energy as a function of quantum well layer thickness.

One significant advantage of using multiple quantum wells of varying width is that the resultant spectrum of quantum well bandgaps can be tailored to fit the incident spectrum, e.g., the solar spectrum. FIG. 1 shows the variation in energy gap vs. layer thickness for thin layers (quantum wells) of GaAs sandwiched between AlGaAs layers, which is just one of the many possible material combinations that can be used. As can be seen, the effective energy gap variation is controlled by the layer thickness, not the material type. This is a degree of freedom not utilized in prior art photovoltaic cells. Moreover, the current collected by each junction can also be controlled by varying the layer thickness as is known, and/or the number of layers of a given thickness.

Figure 2:
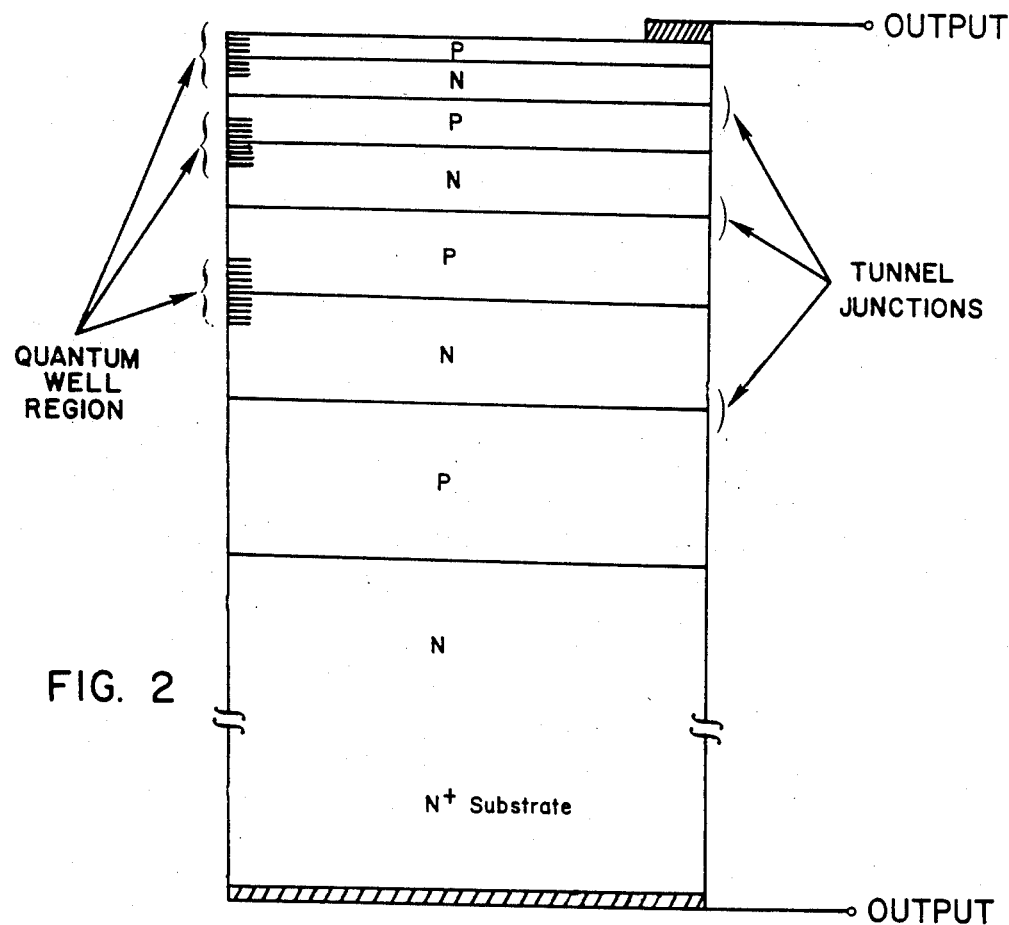
FIG. 2 is a schematic depiction of one structure of a quantum well multijunction photovoltaic cell.

A typical structure for the multijunction photovoltaic cell of this invention is shown in FIG. 2. The gross structure is that of a sequence of p-n junctions electrically connected to one another, preferably by tunnel junctions or equivalent connections. The sequence of layers composing the p-n junctions, as is conventional, will be grown upon a conventional semiconductor substrate, preferably one which has a good lattice match with the layer materials. Fully conventional electrode connections will be made for photovoltaic cells so that the photocurrent can be passed from the cell into an end use device.

Each of the junctions will comprise a series of thin semiconductor layers, all layers being of the p-type on the p-side of the junction and all layers being of the n-type on the n-side of the junction. On each of the junction sides, the sequence of layers will comprise alternating barrier layers and quantum well layers. These are schematically depicted in FIG. 2 and are more clearly shown in FIG. 3.

Figure 3:
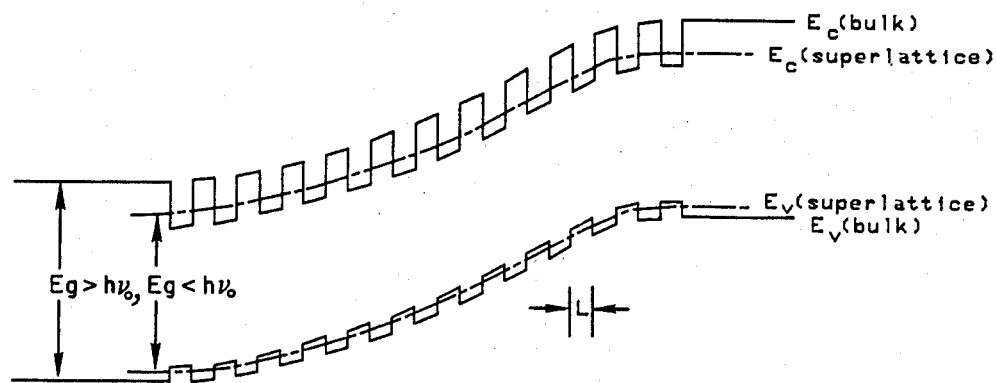
FIG. 3 shows the detail surrounding one of the p-n junctions in the cell of FIG. 2.

In FIG. 3, L represents the width of the alternating quantum well junction layers. The alternating barrier layers have bandgaps (Eg > $h\nu_o$) represented by $E_c/E_v$ (bulk) in the figure. The effective bandgap (Eg < $h\nu_o$) of the overall superlattice, i.e., the overall sequence of layers is represented by $E_c/E_v$ (superlattice) in FIG. 3. The energy bandgap of the material of which the quantum well layers are composed has a bandgap in bulk thickness which is less than that of the bulk bandgap of the barrier layers and the effective bandgap of the quantum well layers, i.e., of the superlattice structure overall. The diffference between the bulk bandgaps of the barrier and quantum well materials is not critical and will be selected routinely in accordance with the desired characteristics for the p-n junctions as described herein.

As can be seen, the quantum mechanical effects derived from the thinness of the quantum well layers produce an effective bandgap in the superlattice p-n junction which is wider than that of the semiconductor material forming the quantum well layers when the material is in bulk thickness but narrower than that of the energy bandgap of the barrier layer material. As a result, the presence of the quantum well layers forms a potential energy well which effectively traps the carriers from the barrier region and becomes determinative of the photon energy required to generate a photocurrent. Of course, in fact, the quantum well will define a series of quantum levels. See, e.g., Panisch, supra. The alternating quantum well layers in essence form a "new" material whose energy gap lies between that of the wide and narrow bandgap materials making up the alternating layers. Since these quantum wells are tightly coupled, carrier movement through the p-n junction will be analogous to that of a normal p-n junction.

The thickness of the quantum well layers and of the barrier layers will be selected to ensure that both the quantum well effect and, especially, preferably also the strained-layer superlattice effect are achieved. Typically, the thicknesses of the quantum well layers will be in the range of about 50–500 Å. The lower limit is typically limited by the inability to grow satisfactory layers which are thinner. The upper limit is typically determined by the need to avoid defects such as dislocations in the crystal structure due to lattice mismatches and/or by the need to maintain sufficient thinness so that the quantum well effect will be achieved. For a well lattice matched system, the upper limit will tend to be set by the need to achieve quantum well effects; for a less well matched system, the upper thickness will more likely be set by constraints of the strained-layer superlattice effect (see below). Thus, at larger layer thicknesses, the intermediate layer intended to be the quantum well layer will act as a normal bulk semiconductor region, e.g., at thicknesses on the order of about 500 to thousands of angstroms.

Typically, the barrier layers will also be of more or less the same thickness, i.e., 50–500 Å. The upper limit will be determined by the need to maintain the strained layer superlattice effect discussed more in detail below, the lower limit again being dictated by layer growth technology. The primary requirement for the barrier layers is that they in fact do provide a potential barrier for carriers in the quantum well region.

The number of layers in a given p-region or n-region of a given p-n junction will not be critical. At a minimum, it will be necessary to have at least two barrier layers surrounding one quantum well layer. Of course, for any practical application, a larger number of layers will be required. Typically, the upper limit on the number of layers in a given p-n junction will be selected to ensure that essentially all of the radiation impinging on the junction with an energy greater than that of its bandgap will be absorbed at that junction or by the combination of all junctions having essentially the same bandgap. That is, the total number of layers will be selected in view of the spectrum of the impinging radiation and the effective extinction coeficient for the p-n junction(s) as a function of the number of layers in a junction.

Typically, the configuration of each p-n junction will be such that all quantum layers have essentially the same thickness and all barrier layers also have essentially the same thickness. However, this is not necessary, it being possible to have varying thicknesses in a given p-n junction. Typically, each p-n junction will have an overall thickness in the micrometer range, e.g., about 0.5–5 µm, smaller or larger thicknesses, of course, being fully equivalent thereto, the choice of particular thickness being a design parameter in accordance with this application. Similarly, the precise number of layers and overall thickness of the p-region and the n-region in a given p-n junction will also not be critical but will be a design parameter. Thus, it is possible for the p-region and the n-region of a given p-n junction to be of different thicknesses and to incorporate a different number of layers, e.g., depending upon the normal considerations involved in conventional photovoltaic cell technology, particularly the desirability of absorbing all of the impinging radiation capable of generating carriers at the p-n junction taking into account the fact that the depletion region of the junctions of this invention will be thicker than those of conventional photovoltaic cells.

The number of p-n junctions which can be included in a cell of this invention is essentially unlimited and can be quite large in order to improve the efficiency of a solar cell by matching the different bandgaps to the solar spectrum. It has been shown that a large number of junctions can produce a high theoretical efficiency. See, for example, Henry, J. P. Appl. Phys. 51 (8) Aug. 1980, 4494–4500, whose disclosure is incorporated by reference herein. For example, it has been shown that solar cells having 1,2,3, and 36 energy gap junctions can have efficiencies of 37, 50, 56 and 72%, respectively, at 1000 suns concentration. Using the photovoltaic cell of this invention, solar cells of the most diverse types can readily be made tailored to any preferred configuration, e.g., those of Henry, supra, those of Bedair et al, supra, inter alia.

For example, as shown by Bedair et al, supra, a highly efficient multijunction cell will have its widest bandgap junction at the top where the light enters. Thus, the most energetic part of the spectrum will be absorbed in the topmost layers. The bandgap of the deeper regions can be made progressively narrower by simply widening the quantum well layer thicknesses in order to absorb the lower energy parts of the solar spectrum which pass through the high energy absorbing top layers. Finally, the least energetic part of the solar spectrum will be absorbed in the bottommost p-n junctions adjacent to the substrate, as shown, e.g., in FIG. 2 above.

Of course, unless indicated otherwise herein, all details of the construction, design and manufacture of the photovoltaic cells of this invention will be fully conventional as disclosed, e.g., in *Semiconductors and Semimetals* by H. Hovel, Vol. XI, *Solar Cells*, Willardson and Beer, Ed. (Academic Press 1975), whose disclosure is entirely incorporated by reference herein. Thus, design and fabrication of electrodes, antireflection coatings and other conventional features can all be incorporated into the photovoltaic cell of this invention.

The thickness of the semiconductor layers required in the photovoltaic cell of this invention will also be determined, especially in those cases where there is a significant lattice mismatch, by the strong preference to achieve a strained-layer superlattice effect. Achievement of this effect per se is known in the prior art in other devices, see, e.g., Matthews et al, supra, and many other related references. Precise requirements can be fully conventionally determined, perhaps, in conjunction with a few preliminary experiments, e.g., by determination of the precise combination of thicknesses which will minimize misfit dislocations in the overall structure. In essence, by such routine choice of layer thicknesses, despite the fact that two adjacent semiconductor materials would otherwise have a lattice mismatch, the thinness of the layers will enable the overall structure to accomodate the lattice mismatch by layer stretching and compression. By this effect, dislocations which otherwise would propagate from one layer to another are suppressed and instead, e.g., only propagate sideways. Using the strained-layer superlattice approach, lattice mismatches of up to 6–7% can be accommodated. The layer thicknesses which are required will be inversely proportional to the magnitude of the lattice mismatch. For example, the better the lattice match, the larger will be the maximum thickness which can be tolerated. At a 2% lattice mismatch, the upper limit on satisfactory layer thicknesses is about a few hundred angstroms; at a lattice mismatch of about 7%, necessary layer thicknesses approach zero angstroms.

Any suitable epitaxial method can be used to grow the crystal layers in accordance with this invention. However, it is greatly preferred that molecular beam epitaxy be used in view of the precision and control afforded thereby, e.g., Panish, supra, A. Y. Cho et al, Prog. Solid State Chem., 10, 157 (1975); A. Y. Cho, J. Vac. Sci. Technol. 16, 275 (1979); L. L. Chang et al, in *Epitaxial Growth*, J. W. Mathews, Ed. (Academic Press, New York, 1975), part A., p.37; K. Ploog, in *Crystal Growth, Properties and Applications*, L. F. Boschke, Ed. (Springer-Verlag, Heidelberg, 1979); all of whose disclosures are incorporated by reference herein. Precise details of the epitaxial growing steps can be determined by those skilled in the art in conjunction with the requirements discussed herein and other fully conventional considerations.

The electrical connections between the p-n junctions of the photovoltaic cells of this invention can be provided by any compatible shorting junction. However, it is greatly preferred that conventional tunnel junctions be employed. These comprise heavily doped $p^+$-$n^+$ junctions interposed between adjacent p-n junctions of the photovoltaic cell of this invention. These merely require conventional growth of $p^+$ layers and $n^+$ layers at the appropriate points in the alternating quantum well/barrier layers of this invention. See, e.g., U.S. Pat. No. 4,179,702, U.S. Pat. No. 4,255,211, Bedair et al, supra, Lamorte et al, in Proc. 13th Photovoltaic Specialists Conf., pages 874–880, 1978, and Fraas et al, in Proc. 13th Photovoltaic Specialists Conf., pp 886–891, 1978, the disclosures of all of which are hereby incorporated by reference. In a preferred configuration, the bandgap of each tunnel junction per se will be at least as great as and preferably greater than the narrowest bandgap of the quantum well p-n junctions which precede it in the photovoltaic cell of this invention. Preferably, each tunnel junction will have a bandgap greater than all of the quantum well p-n junctions which precede it.

Any combination of semiconductor materials which satisfy the foregoing requirements enabling the achievement of quantum well effects and, preferably, also strained-layer superlattice effects can be employed in this invention. Preferably, the semiconductor layers will be formed from compounds of elements selected from groups III and V of the Periodic Table, typically from aluminum, gallium, indium, phosphorous, arsenic and antimony. Combinations of layers comprising elements of Group IV of the Periodic Table as well as other compatible groups of the Periodic Table can also be used. Typical such materials include $Ga_{1-x}In_xAs$, $Ga_{1-x}Al_xAs$, $Ga_{1-x}In_xP$, and $GaAs_{1-x}P_x$.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

A single junction of the multijunction cells of this invention was fabricated. It represents the first quantum well p-n junction within a strained layer superlattice network. Layers from the InGaAs system on an n-gallium arsenide substrate were used. The substrate had a thickness of 400 $\mu$m. Thereon was grown 1.4 $\mu$m of n-$In_{0.1}Ga_{0.9}As$. Thereon was grown a strained-layer superlattice consisting of alternating layers of 70 Å-GaAs/90Å-$In_{0.2}Ga_{0.8}As$, the first 0.48 $\mu$m being n-type and the successive 0.31 $\mu$m being p-type. At the top of the stack was 1.5 $\mu$m of p-$In_{0.1}Ga_{0.9}As$.

The device structure was grown by molecular beam epitaxy in a Varian 360 MBE system using Ga, In, and As as the source materials. Prior to growth, the n-type (100) GaAs substrates were etched in $H_2SO_4:H_2O_2$ solutions and rinsed in DI water. After mounting and transferring into the growth chamber, each substrate was heated to 580° C. for ~20 minutes under $As_4$ flux to clean the surface, after which the temperature was decreased to 500° C. for growth of the entire epitaxial structure. Two In sources were used, one to provide the In flux necessary to grow the $In_{0.1}Ga_{0.9}As$ buffer and window layers, and the other for the $In_{0.2}Ga_{0.8}As$ superlattice. Ga flux was held constant during each run with a growth rate of ~0.9 $\mu$m/hour for GaAs and correspondingly higher rates for the ternary layers. The buffer layer was grown directly on the GaAs substrate with no intervening layer of GaAs. Growth of the buffer layer was followed immediately by growth of the superlattice by turning off the initial In source and shuttering the second In source on and off. Each of the superlattice layers was grown for approximately 30 seconds, giving GaAs and $In_{0.2}Ga_{0.8}As$ layers of 70 Å and 90 Å, respectively. Growth of the top $In_{0.1}Ga_{0.9}As$ window layer was carried out by turning off the second In source and using the first In source. The n- and p-type dopants were Si and Be, each being added to the flux during growth of the corresponding type layers. After the growth was completed, ohmic contacts were fabricated. Thermally evaporated AuBe/Au was used as the metalization for the top p-type layer and electron-beam evaporated Ge/Au/Ni/Au was used to contact the bottom substrate. Contact alloying was performed at 400° C. in $H_2$ for one minute.

Figure 4:
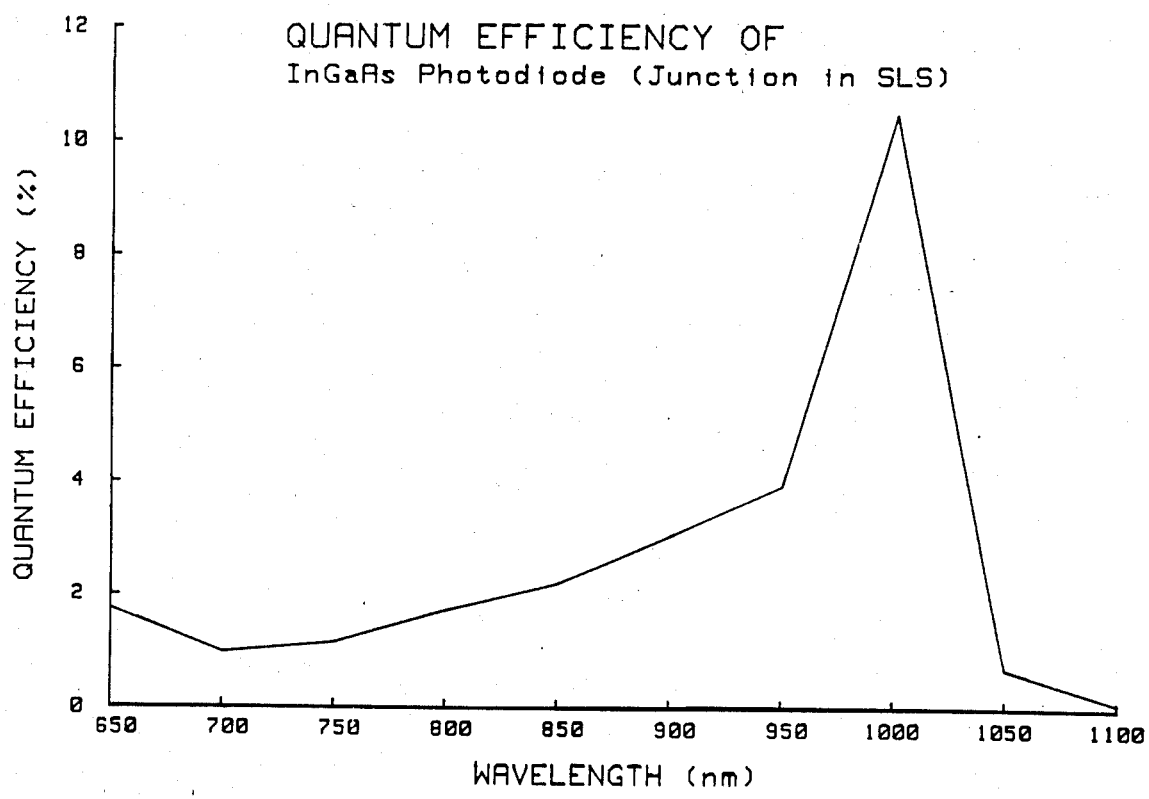
FIG. 4 shows the quantum efficiency of one simple solar cell of this invention.

The quantum efficiency response of this structure is shown in FIG. 4. The peak in the response curve occurs at 1000 nm agreeing with the calculated value for the superlattice. It will be noted that the peak value of the quantum efficiency is relatively low, i.e., only 12%. This is due to the very thick inactive top layer of the device, the lack of an antireflection coating and the lack of other conventional optimizing features. This peak value is thus not indicative of the full capability of the device. It should further be noted that the peak response for GaAs is about 890 nm and that of $In_{0.2}Ga_{0.8}As$ is 1060 nm but that the measured value of the peak response for the superlattice combination is about 1000 nm, a value between the narrow and wide gap materials as described above. Of course, this is due to the quantum mechanical effects of the thin layers producing the described quantum wells.

The preceding example can be repeated with similar success by substituting the generically or specifically described reactants and/or operating conditions of this invention for those used in the preceding example.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A monolithic, quantum well, multilayer, multijunction photovoltaic cell comprising:

at least two p-n junctions electrically connected to each other;

each p-n junction comprising a p-region on one side and an n-region on the other side, each of which regions comprises a series of at least three semiconductor layers, all p-type in the p-region and all n-type in the n-region, said layers forming a strained layer superlattice;

each of said series of layers in each p-n junction comprising alternating barrier and quantum well layers, each barrier layer comprising a semiconductor material having a first bandgap when the semiconductor material is in bulk thickness, and each quantum well layer comprising a semiconductor material that has a second bandgap when the semiconductor material is in bulk thickness, the bandgap being narrower than said first bandgap, the barrier layers sandwiching each quantum well layer and each quantum well layer being present in less than bulk thickness and being sufficiently thin that the width of its operational bandgap in each p-n junction is between said first and second bandgaps, said operational bandgap being the effective bandgap of the p-n junction;

the operational bandgap of at least one of said p-n junctions being different from that of at least one other p-n junction;

whereby radiation incident on said cell and above an energy determined by the operational bandgap of at least one of said p-n junctions will be absorbed and will produce an electrical potential across said junction.

2. A photovoltaic cell of claim 1 wherein the p-n junctions are electrically connected by tunnel junctions comprising a $p^+$ semiconductor layer and an $n^+$ semiconductor layer forming a $p^+$-$n^+$ tunnel junction therebetween.

3. A photovoltaic cell of claim 2 wherein all quantum well bandgaps in a p-n junction are of essentially the same width.

4. A photovoltaic cell of claim 2 wherein at least two p-n junctions are composed of the same semiconductor materials, and said p-n junctions have quantum well layers of different thicknesses such that said junctions have different quantum well bandgaps.

5. A photovoltaic cell of claim 2 wherein the p-n junctions are arranged in the order of decreasing bandgap such that, in operation, higher frequency radiation will be absorbed in layers preceding layers which absorb lower frequency radiation, and wherein said tunnel junctions have bandgaps which are at least as large as the narrowest gap of the p-n junctions which precede it.

6. A photovoltaic cell of claim 5 which is a solar cell wherein the number of layers in each p-n junction, the number of p-n junctions and the bandgaps of each p-n junction are selected such that essentially all of the impinging solar radiation in the U.V. through near infrared range will be absorbed.

7. A photovoltaic cell of claim 6 containing about 36 different energy bandgaps.

8. A photovoltaic cell of claim 2 further comprising a semiconductor substrate upon which said layers are grown; and electrical contacts for passing current out of said cell upon irradiation thereof with radiation which produces a potential across at least one of said p-n junctions.

9. A photovoltaic cell of claim 8 further comprising an antireflection coating as the top layer of said cell.

10. A photovoltaic cell of claim 8 which is a solar cell wherein the p-n junctions are arranged in the order of decreasing bandgap such that, in operation, higher frequency radiation will be absorbed in layers preceding layers which absorb lower frequency radiation, and wherein said tunnel junctions have bandgaps which are at least as large as the narrowest gap of the p-n junctions which precede it;

wherein the semiconductor layers are grown by molecular beam epitaxy; and wherein the semiconductor layers of the p-n junctions comprise binary, ternary or quaternary compounds of the elements Al, Ga, In, P, As or Sb.

11. A photovoltaic cell of claim 10 further comprising an antireflection coating as the top layer of said cell, and wherein the number of layers in each p-n junction, the number of p-n junctions and the bandgaps of each p-n junction are selected such that essentially all of the impinging solar radiation in the U.V. through near infrared range will be absorbed.

12. In a method of generating electricity by contacting solar radiation with a solar cell, the improvement wherein the solar cell is a photovoltaic cell of claim 8.

13. A photovoltaic cell of claim 2 wherein the number of layers in each p-n junction and the number of p-n junctions of a given bandgap are selected such that the cell will absorb essentially all of the radiation impinging thereon which is of an energy greater than or equal to said bandgap.

14. A photovoltaic cell of claim 2 wherein the semiconductor layers are grown by molecular beam epitaxy.

15. A photovoltaic cell of claim 2 wherein the semiconductor layers of the p-n junctions comprise binary, ternary or quaternary compounds of the elements Al, Ga, In, P, As or Sb.

16. A photovoltaic cell of claim 15 wherein the semiconductor layers of the p-n junctions comprise: $Ga_{1-x}In_xAs$, $Ga_{1-x}Al_xAs$, $Ga_{1-x}In_xP$, or $GaAs_{1-x}P_x$.

17. A photovoltaic cell of claim 16 wherein the layer thicknesses in the p-n junctions are in the range of about 50 Å to about 500 Å.

* * * * *